United States Patent [19]

Vergnolle

[11] 4,005,467
[45] Jan. 25, 1977

[54] HIGH-POWER FIELD-EFFECT TRANSISTOR AND METHOD OF MAKING SAME

[75] Inventor: Claude Vergnolle, Paris, France
[73] Assignee: Thomson-CSF, Paris, France
[22] Filed: Aug. 22, 1975
[21] Appl. No.: 606,946

Related U.S. Application Data

[63] Continuation-in-part of Ser. No. 412,785, Nov. 5, 1973, abandoned.

[30] Foreign Application Priority Data

Nov. 7, 1972   France .............................. 72.39347

[52] U.S. Cl. .................................. 357/22; 357/20; 357/55; 357/58; 357/68
[51] Int. Cl.$^2$ ........................................ H01L 29/80
[58] Field of Search .................. 357/20, 22, 55, 58, 357/68

[56] References Cited

UNITED STATES PATENTS

| | | | |
|---|---|---|---|
| 3,344,324 | 9/1967 | Beale | 357/22 |
| 3,629,667 | 12/1971 | Lubart et al. | 357/55 |
| 3,663,873 | 5/1972 | Yagi | 357/22 |
| 3,701,696 | 10/1972 | Mets | 357/55 |

Primary Examiner—Michael J. Lynch
Assistant Examiner—Joseph E. Clawson, Jr.
Attorney, Agent, or Firm—Karl F. Ross; Herbert Dubno

[57] ABSTRACT

A field-effect transistor designed for high-power operation has a P$^+$ substrate, preferably of gallium arsenide, topped by an N layer which in turn is covered by a much thinner N$^+$ film, the layer and film being bisected by a serpentine trench so as to form a pair of interdigitated comb-shaped N$^+$ segments overlain by metallic deposits which constitute a source and a drain electrode. The trench, advantageously produced by ion bombardment which also has a passivating effect on the surface areas thus exposed, cuts deep enough into the N layer to leave a channel whose conductivity is controlled by a gate electrode substantially coextensive therewith on the opposite substrate face. The prismatic substrate body is peripherally bounded by a mesa flank which may be passivated by a deposit of low-melting glass.

9 Claims, 6 Drawing Figures

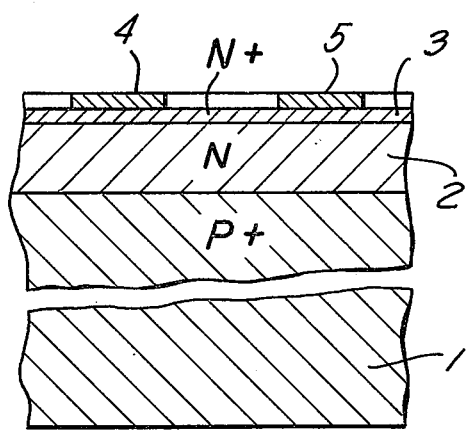
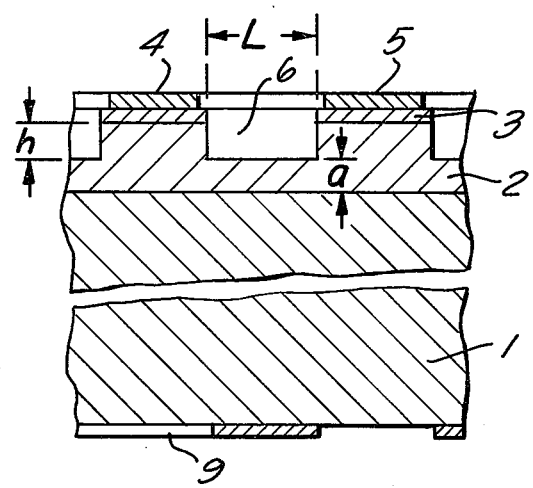
FIG. 1　　　　　FIG. 2
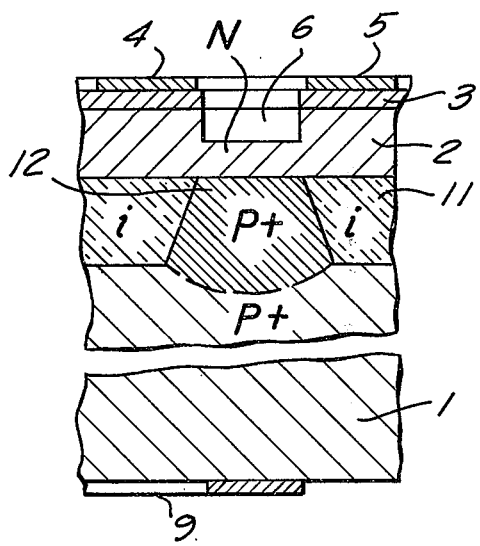
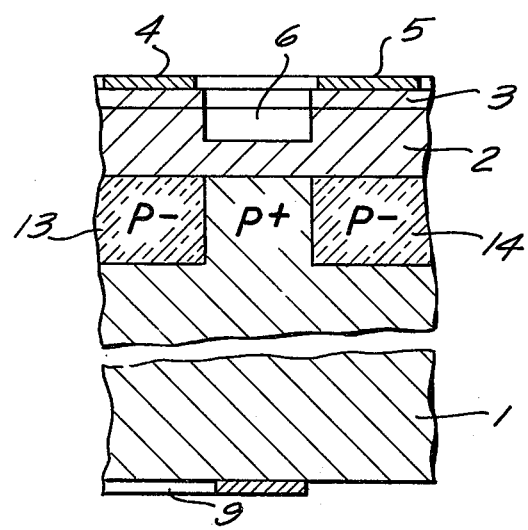
FIG. 5　　　　　FIG. 6

HIGH-POWER FIELD-EFFECT TRANSISTOR AND METHOD OF MAKING SAME

CROSS-REFERENCE TO RELATED APPLICATION

This application is a continuation-in-part of my copending application Ser. No. 412,785 filed Nov. 5, 1973 and now abandoned.

FIELD OF THE INVENTION

My present invention relates to a high-power field-effect transistor of the type provided with a so-called bottom gate, i.e. a conductivity-controlling electrode on a surface of a semiconductive substrate opposite another surface thereof which carries two main electrodes (source and drain), separated by a conduction channel, as well as to a process for making such a transistor.

BACKGROUND OF THE INVENTION

It is known, e.g. from U.S. Pat. No. 3,344,324 to produce a field-effect transistor (FET) of this description from a substrate of a first conductivity type (P) integrally formed with a layer of the opposite conductivity type (N) supporting source and drain electrodes which are separated by a groove or trench, the latter terminating short of a P/N junction existing between the layer and the substrate so as to leave a narrow N-type channel whose conductivity can be controlled by a gate electrode deposited on the opposite substrate surface. The main electrodes are in contact with a more highly conductive region of the N-type layer obtained by the diffusion of impurities into that layer from the exposed surface thereof. This local enrichment of a semiconductive layer with charge carriers by a diffusion technique, however, is very difficult to carry out with certain semiconductor materials, such as gallium arsenide (AsGa).

Another problem arising with such FETs, especially those designed to operate under high power at elevated frequencies, is the need for preventing discharges ("flashing") between the source and drain electrodes across the intervening trench. It is also important to avoid the flow of leakage currents across the exposed surface areas of the layer which bound the semiconductive body.

OBJECTS OF THE INVENTION

The general object of my invention, therefore, is to provide an improved FET and a method of making same which obviate the aforestated difficulties.

Another object is to provide a FET of the bottom-gate type in which stray capacitances between the gate and the main electrodes are minimized even with a meandering or serpentine trench designed, as known per se, to lengthen the intervening channel.

A more particular object is to provide a FET of this character capable of operating at frequencies on the order of ten gigahertz with a power output on the order of one watt.

SUMMARY OF THE INVENTION

In accordance with an important feature of my present invention, a field-effect transistor of the general type discussed above comprises a monocrystalline semiconductive substrate of one conductivity type (e.g. P) forming a preferably prismatic body with an upper and a lower surface, a semiconductive layer of opposite conductivity type (e.g. N) epitaxially grown on the upper surface thereof, and a semiconductive film of the last-mentioned conductivity type (N) epitaxially grown on this layer, the film having a resistivity and a thickness substantially less than those of the layer. The layer and film are provided with a trench cutting completely through the film and partly into the layer to leave a channel whose conductivity is controllable, in the known manner, by the energization of a metallic gate electrode on the lower substrate surface; advantageously, that gate electrode is of substantially the same serpentine configuration as the channel and trench aligned therewith.

I have found, pursuant to another feature of my invention, that the formation of the trench can be accompanied by an automatic passivating treatment of the layer surfaces thus exposed, i.e. of the trench bottom and sides, if the trench is formed by ion bombardment through a suitable mask. If desired, the same technique can be used to form a scarped peripheral edge or mesa flank around the semiconductor body, this flank then requiring no further passivation. Alternatively, such a flank — terminating at or below a P/N junction constituting the boundary between the substrate and the layer — may be made by mechanical machining or chemical etching; in that event an insulating coating will be required for passivation, e.g. of low-melting glass in the case of gallium arsenide.

BRIEF DESCRIPTION OF THE DRAWING

The above and other features of my invention will now be described in detail with reference to the accompanying drawing in which:

FIGS. 1 and 2 are fragmentary sectional views schematically illustrating two stages in the manufacture of a field-effect transistor according to the invention;

FIGS. 5 and 6 illustrate in schematic section two alternate embodiments.

SPECIFIC DESCRIPTION

Figure 4:
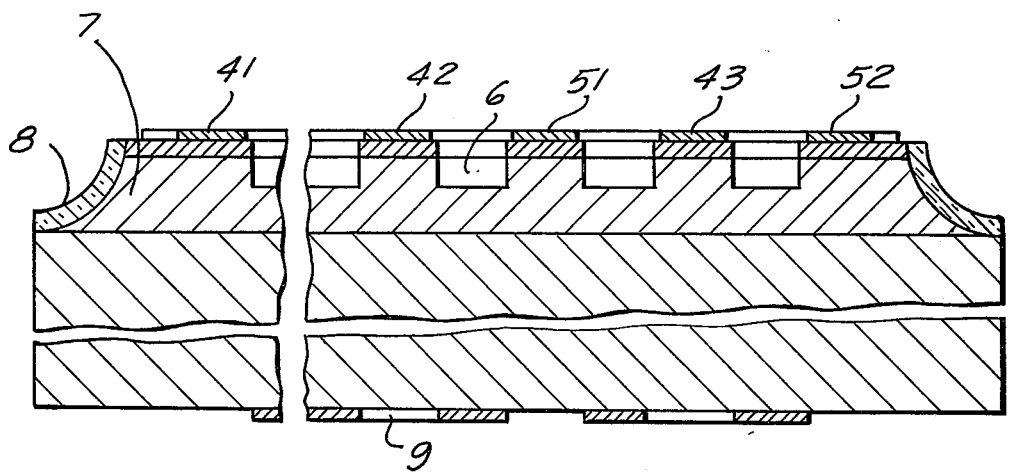
FIG. 4 is a cross-sectional view taken on line IV — IV of FIG. 3.

In FIG. 1, in section, a portion of a field-effect transistor embodying my invention has been shown at a stage preceding the machining of a tranch extending between source and drain. A monocrystalline semiconductor substrate 1 takes the form of a relatively thick chip (100 to 200 microns thickness). Its resistivity is lower than 100 ohm-cm. It is $P^+$ doped, if the transistor is to have an N-type conduction channel as is generally the case, but could also be $N^+$ doped to give a P-type channel. The preferred semiconductor material is gallium arsenide. An N-type layer 2 has been deposited by epitaxy upon the substrate; its thickness is on the order of one micron. An $N^+$-doped layer 3 forming a very thin film (on the order of 2000 angstroms for example) is produced, by epitaxy, upon the N-type layer 2 in order to form the future contact areas for the source and the drain electrodes. These electrodes are constituted by metal deposits 4 and 5 produced, for example, by evaporation of a metal in vacuo in the form of uniform layer subsequently cut to shape by a photoechting technique, ion machining, or the like. In fact, the contacts visible in FIG. 1 are two teeth respectively belonging to two interleaved comb-shaped patterns; this arrangement will be more readily understood from a consideration of FIG. 3 where pairs of teeth such as those marked 42 and 51 can be seen in perspective.

The distances between two teeth are determined by the frequency at which the transistor is to operate, being for example on the order of one micron for a frequency of ten gigacycles per second with an AsGa substrate. Currently available techniques of etching by electronic or ultraviolet masking, associated with chemical or ion machining, enable dimensions of this size to be achieved.

FIG. 2 illustrates the next stage of the manufacture of the transistor in accordance with the invention. A trench 6 has been carved, advantageously by ion bombardment through a nonillustrated mask, which penetrates in the semiconductor material to a certain depth $h$ through the layer 2 to a distance $a$ from the interface between the layers 1 and 2. The width L of the trench 6 may be, for example, on the order of one micron, and substantially optimum conditions are achieved for $a \approx L/2$.

The thickness $h$ of the layers 2 will be so chosen as to ensure that the transistor has the maximum breakdown voltage. The ion-bombardment machining of the trench may be carried out in the same operation which produces the interdigitated main electrodes 4, 5.

A gate electrode 9 of serpentine configuration, coextensive with trench 6, is deposited on the lower substrate face as also shown in FIG. 2.

Figure 3:
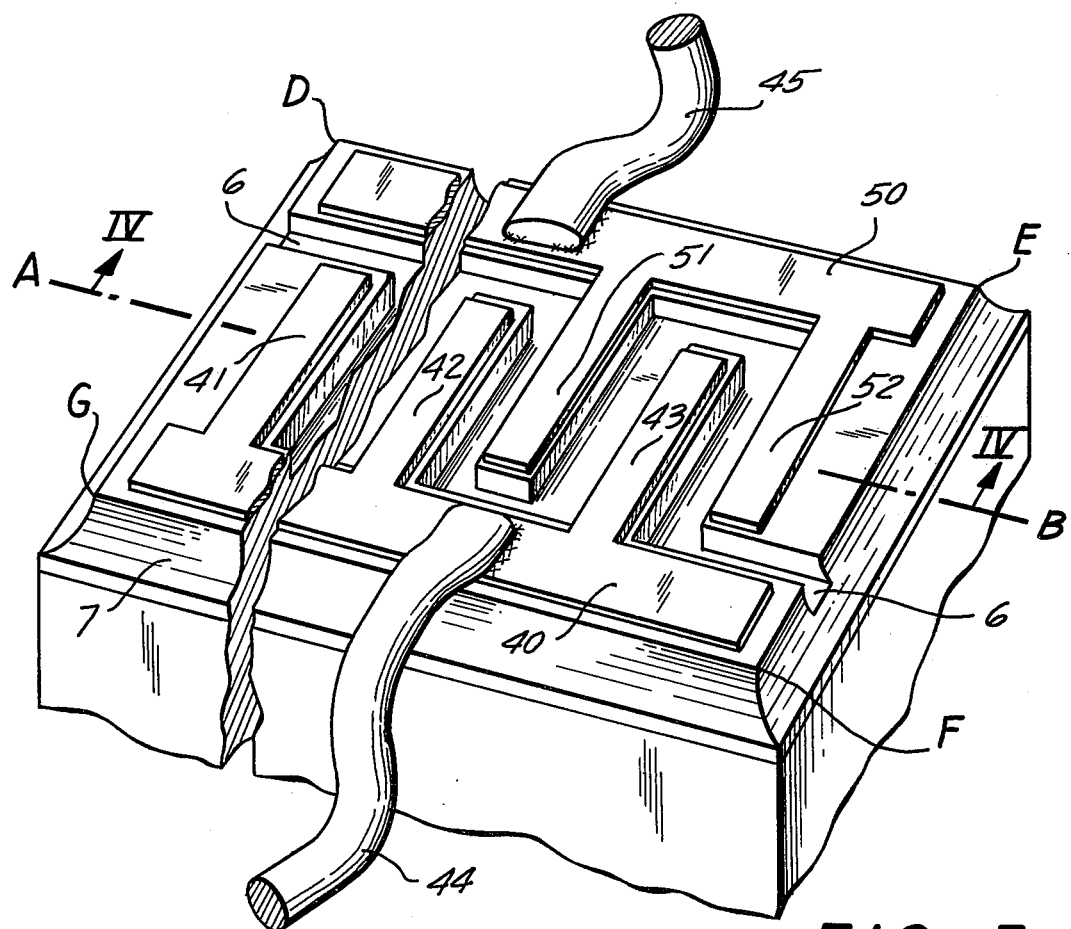
FIG. 3 is a perspective view of the FET so produced.

FIG. 3 illustrates in perspective the top part of the prismatic body of a transistor in accordance with the invention during the last stage of its manufacture. The source electrode comprises a metallized area 40, parallel to a line A-B longitudinally bisecting the upper surface of the semiconductor body, and rectangular teeth 41, 42 etc. The drain electrode likewise comprises a metallized area 50 and teeth 51, 52, etc. similar to those of the source electrode but arranged in such a fashion that if a section is taken in a plane passing through the centerline A-B, corresponding to the view of FIG. 4, then successively the teeth 41, 50, 42, 51, 43, 52 etc. are encountered. The input and output connections 44, 45 of the transistor are soldered to the metallized areas 40 and 50. These connections can be of the "beam lead" type.

The trench 6, shown in FIGS. 2 – 4, here has a rectangular serpentine configuration bounded by the interdigitated teeth and the metallized contact areas. If the field-effect transistor included simply the open-ended trench 6 extending between the source and the drain, these electrodes would be short-circuited by the periphery of the layer 3. Consequently, not only the layer 3 but also the layer 2 and the substrate are machined around the whole periphery down to at least the level of layer 2, in order to insulate the transistor from any adjoining devices and also to prevent the flow of leakage currents through the layer 1 and the P/N semiconductor junction.

In practice, a mesa-type scarping (e.g. etching) operation may be carried out for creating a flank 7 which delimits a rectangular mesa DEFG. On the scarped flank 7, by the use of a selective technique, an insulating or passivating coating 8 (FIG. 4) is deposited in order to enhance the long-term stability of the transistor and its resistance to environmental stresses. Among the various varnish types normally used for microwave mesa structures, in the case of silicon, a silica protective coating applied by a conventional passivating technique may be employed. However, this method requires a heat treatment which has the effect of shifting the P/N junction, especially in the case of gallium arsenide; in that instance, therefore, passivation is advantageously carried out by low-temperature deposition of a low-melting glass unless ion bombardment is used in scarping the edge 7.

The gate 9 is produced by a metal deposit on the substrate undersurface opposite the trench 6 and aligned therewith.

FIG. 5 illustrates a modification in which the P$^+$ substrate is separated from the layer 2 by zones 11 of intrinsic semiconductor material or semiconductor material which is but weakly doped, the intervening region 12 of serpentine shape being P$^+$ doped and extending parallel to trench 6 within the semiconductor material. The layer 11 is grown epitaxially and the region 12 is produced, for example, by a diffusion operation which is continued until the layer 1 is encountered in order to ensure the existence of a conductive bridge between the gate 9 and the channel defined by trench 6. The region 12 could also be produced by ion implantation. These techniques are, however, not practical with AsGa and are therefore useful only with other semiconductors such as silicon.

Another modification, particularly applicable in the case of gallium arsenide, has been shown in FIG. 6. Here, intrinsic zones 13 and 14 have been produced in the substrate 1 by proton implantation, defining between them a meandering P$^+$ region in line with trench 6 and gate electrode 9.

In the embodiments of FIGS. 5 and 6 the weakly doped regions 11 and 14 are limited to that part of the substrate which is located beneath the metallized contact areas 40 and 50. This results in a significant reduction of parasitic capacitances present between the substrate 1 and the metallized areas 40 and 50. Thus, a substantial improvement in the performance of the transistor is achieved, without the need for a complicated and highly accurate mask.

Among the advantages of the invention, the following should be mentioned in addition to those referred to above:

a. the convenience of arrangement in parallel, thanks to the comb-shaped pattern, of a large number of elementary transistors, so that high-power devices can be obtained;

b. the reduction in the electron transit time due to the fact that the source and drain can be formed, along with the intervening channel, in a single operation which is that of machining the trench 6; this makes it possible to reduce the width L of the conduction channel and to increase the operating frequency;

c. the reduction in parasitic resistance as a consequence of the small dimensions (width, thickness) of the conduction channel;

d. the reduction in the gate input resistance in view of the fact that the latter is constituted by a substantial part of the substrate of the transistor;

e. the excellent insulation of the transistor achieved by the scarping of the chip edge;

f. the simplification of the manufacture solely by epitaxial and surface-shaping operations, particularly with the use of gallium arsenide.

The invention is applicable to microwave power-supply systems and to the production of very-high-speed logic circuits.

In actual tests, an FET as described above — with an AsGa substrate and a trench 6 made by ion-bombardment machining — was operated at 6 GHz with an output power of 1 watt, a gain of 6 dB and efficiency of 35%.

I claim:
1. A field-effect transistor comprising:
a monocrystalline semiconductive substrate of one conductivity type forming a body with an upper and a lower surface;
a semiconductive layer of opposite conductivity type overlying said upper surface;
a semiconductive film of a resistivity and a thickness substantially less than those of said layer and of said opposite conductivity type disposed on said layer, said layer and film being provided with a trench cutting through said film and partly into said layer to leave a channel of controllable conductivity, said trench subdividing said layer and film into two semiconductive segments bounded by passivated surface areas;
a pair of metallic deposits respectively overlying said segments and forming a pair of main electrodes separated by said trench; and
a metallic gate electrode on said lower surface in line with said channel.

2. A field-effect transistor as defined in claim 1 wherein said trench and said gate electrode extend along substantially coextensive serpentine paths.

3. A field-effect transistor as defined in claim 1 wherein said passivated surface areas include the bottom and sides of said trench.

4. A field-effect transistor as defined in claim 1 wherein said substrate, layer and film consist essentially of gallium arsenide.

5. A field-effect transistor as defined in claim 1 wherein said body is peripherally scarped with formation of a surrounding mesa flank forming part of said passivated surface areas, said flank extending at least to a boundary between said substrate and said layer.

6. A field-effect transistor as defined in claim 5 wherein said flank is provided with an insulating coating.

7. A field-effect transistor as defined in claim 6 wherein said substrate, layer and film consist essentially of gallium arsenide, said coating consisting of a low-melting glass.

8. A field-effect transistor as defined in claim 7 wherein said substrate has P-type conductivity in regions underlying said trench and nearly intrinsic conductivity in zones underlying said semiconductive segments.

9. A field-effect transistor as defined in claim 1 wherein the bottom of said trench is spaced from said substrate by a distance corresponding to substantially half the width of said trench.

* * * * *